United States Patent
Abdo

(10) Patent No.: US 10,097,143 B2
(45) Date of Patent: Oct. 9, 2018

(54) JOSEPHSON-COUPLED RESONATOR AMPLIFIER (JRA)

(71) Applicant: INTERNATIONAL BUSINESS MACHINES CORPORATION, Armonk, NY (US)

(72) Inventor: Baleegh Abdo, Carmel, NY (US)

(73) Assignee: International Business Machines Corporation, Armonk, NY (US)

( * ) Notice: Subject to any disclaimer, the term of this patent is extended or adjusted under 35 U.S.C. 154(b) by 611 days.

(21) Appl. No.: 14/754,315

(22) Filed: Jun. 29, 2015

(65) Prior Publication Data
US 2017/0085231 A1    Mar. 23, 2017

(51) Int. Cl.
| | |
|---|---|
| H03F 15/00 | (2006.01) |
| H03F 1/42 | (2006.01) |
| H03F 19/00 | (2006.01) |
| G06N 99/00 | (2010.01) |

(52) U.S. Cl.
CPC ............. *H03F 1/42* (2013.01); *G06N 99/002* (2013.01); *H03F 15/00* (2013.01); *H03F 19/00* (2013.01)

(58) Field of Classification Search
CPC ...................................................... H03F 15/00
USPC ...................................................... 330/62, 63
See application file for complete search history.

(56) References Cited

U.S. PATENT DOCUMENTS

| | | | | |
|---|---|---|---|---|
| 4,117,503 A | * | 9/1978 | Zappe ................... | H01L 39/223 257/36 |
| 6,900,454 B2 | * | 5/2005 | Blais ...................... | B82Y 10/00 257/14 |
| 7,570,075 B2 | | 8/2009 | Gupta et al. | |
| 7,724,083 B2 | | 5/2010 | Herring et al. | |
| 7,932,514 B2 | | 4/2011 | Farinelli et al. | |
| 8,169,231 B2 | | 5/2012 | Berkley | |
| 8,188,752 B2 | * | 5/2012 | Ketchen ............. | G01R 31/2637 324/637 |
| 8,508,280 B2 | * | 8/2013 | Naaman ................. | B82Y 10/00 326/3 |
| 8,861,619 B2 | | 10/2014 | McDermott et al. | |
| 8,975,912 B2 | * | 3/2015 | Chow ................... | G06N 99/002 326/3 |
| 9,344,092 B2 | * | 5/2016 | Abraham ........... | H03K 19/1954 |
| 2013/0015885 A1 | * | 1/2013 | Naaman ................ | H03K 3/38 327/1 |

(Continued)

OTHER PUBLICATIONS

Abdo, et al., "Josephson Directional Amplifier for Quantum Measurement of Superconducting Circuits", Department of Applied Physics, Yale University, New Haven, Connecticut, Apr. 2014, 5 pages.

(Continued)

*Primary Examiner* — Henry Choe
(74) *Attorney, Agent, or Firm* — Tutunjian & Bitetto, P.C.; Vazken Alexanian

(57) ABSTRACT

A Josephson-coupled resonator amplifier is provided. The Josephson-coupled resonator amplifier includes a first and a second resonator, each formed from respective lumped-element capacitance and respective lumped-element inductance. The Josephson-coupled resonator amplifier further includes one or more Josephson junctions coupling the first resonator to the second resonator, whereby a superconducting loop is formed from at least the lumped-element inductance of the resonators and the one or more Josephson junctions.

20 Claims, 5 Drawing Sheets

(56) References Cited

U.S. PATENT DOCUMENTS

2016/0233860 A1* 8/2016 Naaman .............. H03K 17/92
2016/0292587 A1* 10/2016 Rigetti .............. G06N 99/002
2017/0062107 A1* 3/2017 Naaman .............. H03K 17/92

OTHER PUBLICATIONS

Abdo, et al., "Nondegenerate Three-wave Mixing with the Josephson Ring Modulator, Department of Applied Physics", Yale University, New Haven, Connecticut, Jan. 2013, 18 pages.

Bergeal et al., "Phase-preserving Amplification Near the Quantum Limit with a Josephson Ring Modulator", vol. 465|6, May 2010, pp. 64-69.

Hatridge, et al., "Dispersive Magnetometry with a Quantum Limited SQUID Parametric Amplifier", Department of Physics, University of California, Berkeley, California, Apr. 2011, 8 pages.

Vijay, et al., "Invited Review Article: The Josephson Bifrucation Amplifier", Quantum Nanoelectronics Laboratory, Department of Physics, University of California, Berkeley, California, Nov. 2009, 17 pages.

* cited by examiner

JOSEPHSON-COUPLED RESONATOR AMPLIFIER (JRA)

BACKGROUND

Technical Field

The present invention relates generally to electronic devices and, in particular, to a Josephson-coupled resonator amplifier (JRA).

Description of the Related Art

Non-degenerate Josephson amplifiers such as the Josephson parametric amplifier (JPC) are quantum-limited devices which can be used to perform high-fidelity quantum non-demolition measurements of qubits. However, they suffer from several drawbacks such as, (1) a narrow bandwidth on the order of 10 MHz, (2) a relatively small dynamic range on the order of a few photons at the signal frequency per dynamical bandwidth, and (3) a complicated auxiliary drive circuit. All these drawbacks make the JPC less attractive for scalable architectures. Hence, finding a better alternative that solves these problems is highly desirable.

SUMMARY

According to an aspect of the present principles, a Josephson-coupled resonator amplifier is provided. The Josephson-coupled resonator amplifier includes a first and a second resonator, each formed from respective lumped-element capacitance and respective lumped-element inductance. The Josephson-coupled resonator amplifier further includes one or more Josephson junctions coupling the first resonator to the second resonator, whereby a superconducting loop is formed from at least the lumped-element inductance of the resonators and the one or more Josephson junctions.

According to another aspect of the present principles, a Josephson-coupled resonator amplifier is provided. The Josephson-coupled resonator amplifier includes a first and a second resonator, formed from lumped-element capacitance and inductances of one or more direct current superconducting quantum interference devices. The Josephson-coupled resonator amplifier further includes one or more Josephson junctions coupling the first resonator to the second resonator, whereby a superconducting loop is formed from at least the inductances of the direct current superconducting quantum interference devices and the one or more Josephson junctions.

According to yet another aspect of the present principles, a method is provided. The method includes forming a Josephson-coupled resonator amplifier. The forming step includes forming a first and a second resonator from lumped-element inductances and capacitances. The forming step further includes forming one or more Josephson Junctions connecting the first resonator to the second resonator, whereby a superconducting loop is formed from at least the inductances of the first and second resonators and the one or more Josephson junctions.

These and other features and advantages will become apparent from the following detailed description of illustrative embodiments thereof, which is to be read in connection with the accompanying drawings.

BRIEF DESCRIPTION OF DRAWINGS

The disclosure will provide details in the following description of preferred embodiments with reference to the following figures wherein.

DETAILED DESCRIPTION OF PREFERRED EMBODIMENTS

The present principles are directed to a Josephson-coupled resonator amplifier (JRA).

In an embodiment, we provide a non-degenerate quantum-limited Josephson parametric amplifier that is better suited for scalable quantum architectures than the Josephson Parametric Converter (JPC). In particular, it is expected to have a larger bandwidth and dynamic range than JPCs whose resonators are implemented using transmission lines, and possess a better topology and simpler drive circuit than JPCs in general.

The present principles can be implemented using standard nanofabrication techniques and tools. The resonators, feedlines, and hybrid coupler of the device can be implemented using standard lithography process. The Josephson junctions of the device can be implemented using e-beam lithography and they can be made of, for example, either Aluminum or Niobium.

In an embodiment, the Josephson-coupled resonator amplifier according to the present principles can operate at the quantum limit and uses analog signals. In an embodiment, the pump drive is fed through a separate port than the input and output signals of the device. In an embodiment, the feedlines for the first signal, second signal, and pump drive can be positioned on different locations on-chip.

Figure 1:
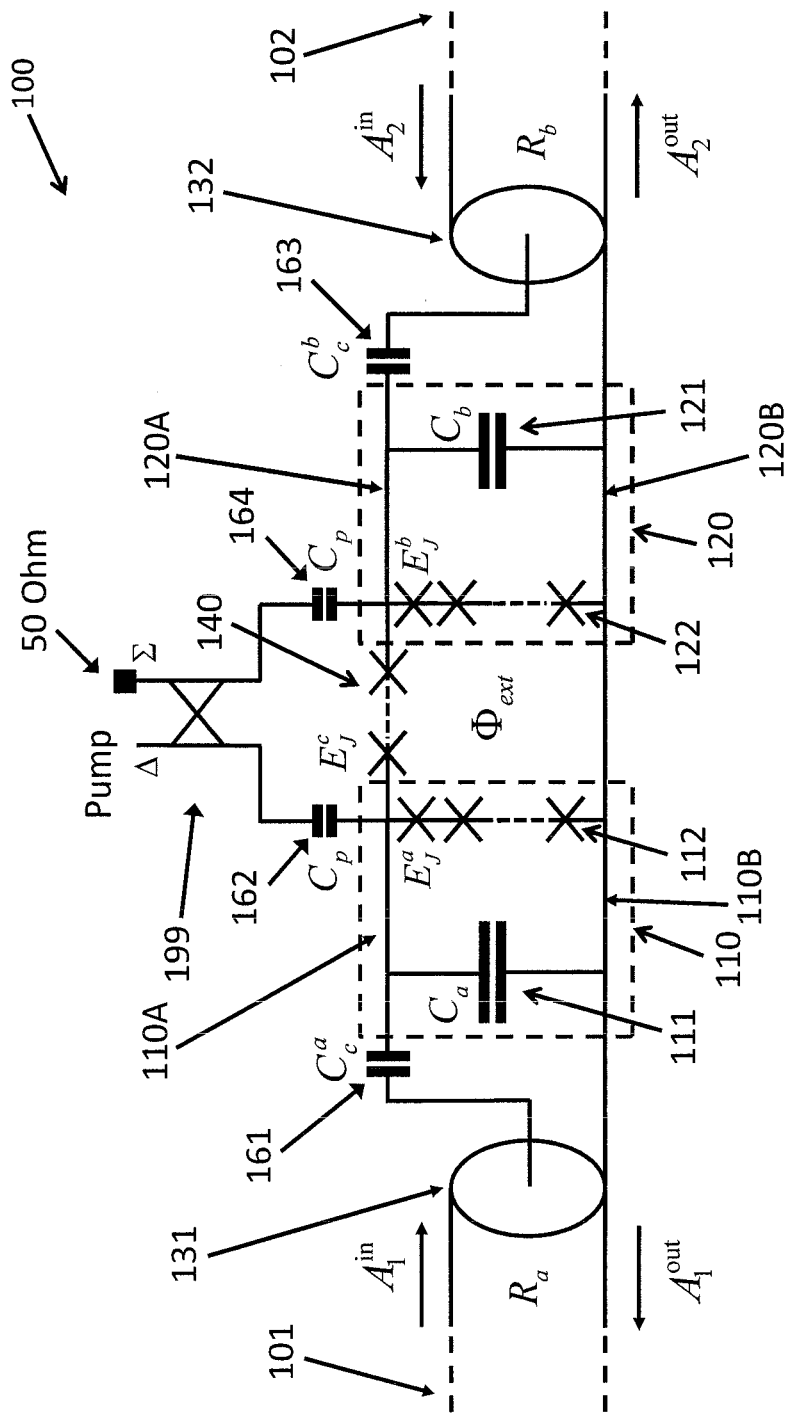
FIG. 1 shows an exemplary circuit for a Josephson-coupled resonator amplifier (JRA) 100, in accordance with an embodiment of the present principles.

FIG. 1 shows an exemplary circuit for a Josephson-coupled resonator amplifier (JRA) 100, in accordance with an embodiment of the present principles.

The JRA 100 includes a first resonator a 110 and a second resonator b 120 (also respectively referred to as "resonator a" and "resonator b" in short). The resonator a 110 and b 120 are formed to have different resonance frequencies and/or different impedances. The resonator a 110 has a resonance frequency $f_a$, and the resonator b 120 has a resonance frequency $f_b$. Without loss of generality we assume that $f_a < f_b$. The resonator a 110 includes lumped-element capacitance in the form of a first capacitor $C_a$ 111. The resonator a 110 also includes lumped-element inductance in the form of one or more (e.g., an array of) Josephson Junctions (JJs) 112 each characterized by Josephson energy $E_j^a$. The resonator b 120 includes lumped-element capacitance in the form of a first capacitor G 121. The second resonator b 120 also includes lumped-element inductance in the form of one or more (e.g., an array of) Josephson Junctions (JJs) 122 each characterized by Josephson energy $E_j^b$.

The resonator a 110 is coupled to a first semi-infinite transmission line 101 corresponding to a first port 131. The coupling is either direct or through a coupling capacitance $C_a^c$ 161. The resonator b 120 is coupled to a second semi-infinite transmission line 102 corresponding to a second port 132. The coupling is either direct or through a coupling capacitance $C_b{}^c$ 163. The first semi-infinite transmission line 101 and the second semi-infinite transmission line 102 carry incoming and outgoing waves to the JRA 100. For example, the first semi-infinite transmission line 101 inputs a signal at frequency $f_1$ with wave-amplitude $A_1{}^{in}$ and outputs a signal with wave-amplitude $A_1{}^{out}$, and the second semi-infinite transmission line 102 inputs a signal at frequency $f_2$ with wave-amplitude $A_2{}^{in}$ and outputs a signal with wave-amplitude $A_2{}^{out}$. The first transmission line 101 has a characteristic impedance $R_a$, and the second transmission line 102 has a characteristic impedance $R_b$. The external quality factor $Q_{ext}$ of resonators a and b is determined by the impedance of resonator a and b, the coupling capacitors $C_a{}^c$ and $C_b{}^c$, and the characteristic impedance of the transmission line 101 and 102, respectively. We further assume that the total quality factor of the resonator a and b is dominated by the external quality factor of each resonator. In other words, we assume that the internal loss of the resonator a and b is negligible or equivalently that the internal quality factor $Q_{int}$ of the resonators is very large compared to the external quality factor. Thus, the linear bandwidth $\kappa_a$ of the resonator a and the linear bandwidth $\kappa_b$ of the resonator b is determined by the ratios $2\pi f_a/Q_{ext}{}^a$ and $2\pi f_b/Q_{ext}{}^b$, respectively.

The top node 110A of the first resonator a 110 and the top node 120A of the second resonator b 120 are connected together through one or more (e.g., an array of) Josephson Junctions C 140 (each characterized by Josephson energy $E_j{}^c$). The bottom node 110B of the first resonator a 110 is connected to the bottom node 120B of the second resonator b 120.

The first transmission line 101 is connected to the first resonator a 110 via a coupling capacitor $C_c{}^a$ 161. The second transmission line 102 is connected to the second resonator b 120 via a coupling capacitor $C_c{}^b$ 163. The pump drive is applied through the difference port of a 180 degree hybrid. One output port of the hybrid is coupled to the top node 110A of one resonator a 110 via a coupling capacitor $C_p$ 162 and the second output port of the hybrid is coupled to the top node 120A of resonator b 120 via a coupling capacitor $C_p$ 164. Equivalently, the two output ports of the 180 degree hybrid are connected to either side of the JJ (or array of JJs) 140 through a coupling capacitor $C_p$ (162 and 164).

It is to be emphasized that these transmission lines are not an integral part of the device itself, as they mainly define the device ports, carry the incoming and outgoing waves from and to the device, and set the bandwidth of the device (through their characteristic impedances and coupling capacitors). It is to be appreciated that these transmission lines can be equivalently replaced by 180 degree hybrids on either port. In such a case, the incoming and outgoing signals would enter and exit through the delta/difference port of the hybrid whereas the sum/sigma port would be terminated by 50 Ohms. In any case, the present principles are directed to other elements of the device as described herein and, thus, are not dependent upon the manner and structure employed to carry signals to and from the device such as transmission lines and/or hybrid 180° couplers.

The JRA 100 is capable of performing three-wave mixing operation between three microwave signals. The first microwave signal, interchangeably denoted as signal (S) or ($A_1$), is provided through the first port 131. The second microwave signal, interchangeably denoted as idler (I) or ($A_2$), is provided through the second port 132. The third microwave signal, denoted as pump (P), is a non-resonant coherent tone and is input to the JRA 100 via a difference port (Δ) of the 180° hybrid coupler 199. The pump has a frequency $f_p$ where $f_p=f_a+f_b$. A 50 Ohm termination is provided at a sum port (Σ) of the 180° hybrid coupler 199.

In order to operate the JRA 100 as a quantum-limited phase-preserving amplifier, e.g., to amplify in reflection input signals at frequencies $f_1$ and $f_2$ which lie within the dynamical bandwidth of resonator a and b, one needs to flux-bias the loop that is formed by the Josephson Junctions 140 and the Josephson Junctions 112 and 122 with an adequate flux to give rise to a three-wave mixing process in the device and parametrically modulate the nonlinear inductance that couples the two resonators using a strong, non-resonant, coherent pump tone (fed through a 180° hybrid coupler 199) at the sum of the two resonance frequencies $f_a$ and $f_b$. The Josephson Junctions 112, 122, and 140 form a superconducting loop threaded by an applied magnetic flux $\varphi_{ext}$. The dynamical bandwidth term used in this disclosure represents the bandwidth of the device at a given power gain G.

The JRA 100 parametrically amplifies microwave signals at the quantum-limit using three-wave mixing process. The first microwave tone at frequency $f_1$ is provided through the first port 131 with wave-amplitude $A_1{}^{in}$, where $f_1$ lies within the dynamical bandwidth of the device. The second microwave tone at frequency $f_2$, is provided through the second port 132 with wave-amplitude $A_2{}^{in}$, where $f_2$ lies within the dynamical bandwidth of the device. The third tone, denoted as pump (P), is non-resonant microwave drive and is input to the JRA 100 via a difference port (Δ) of the 180° hybrid coupler 199. The pump has a frequency $f_p$ where, as noted above, $f_p=f_a+f_b$. A 50 Ohm termination is provided at a sum port (Σ) of the 180° hybrid coupler 199. The amplified output signals of the device at frequencies $f_1$ and $f_2$ and wave-amplitudes $A_1{}^{out}$ and $A_2{}^{out}$ propagate on the same transmission lines 101 and 102 respectively. In order to separate the incoming and outgoing signals propagating on the same transmission line a microwave circulator can be connected to each port 131 and 132.

The JRA 100 can also be operated as a noiseless microwave mixer in a very similar manner to the JPC. The main difference in the operation of the device is that the applied pump frequency $f_p$ is equal to the frequency difference $f_p=f_b-f_a$.

Figure 2:
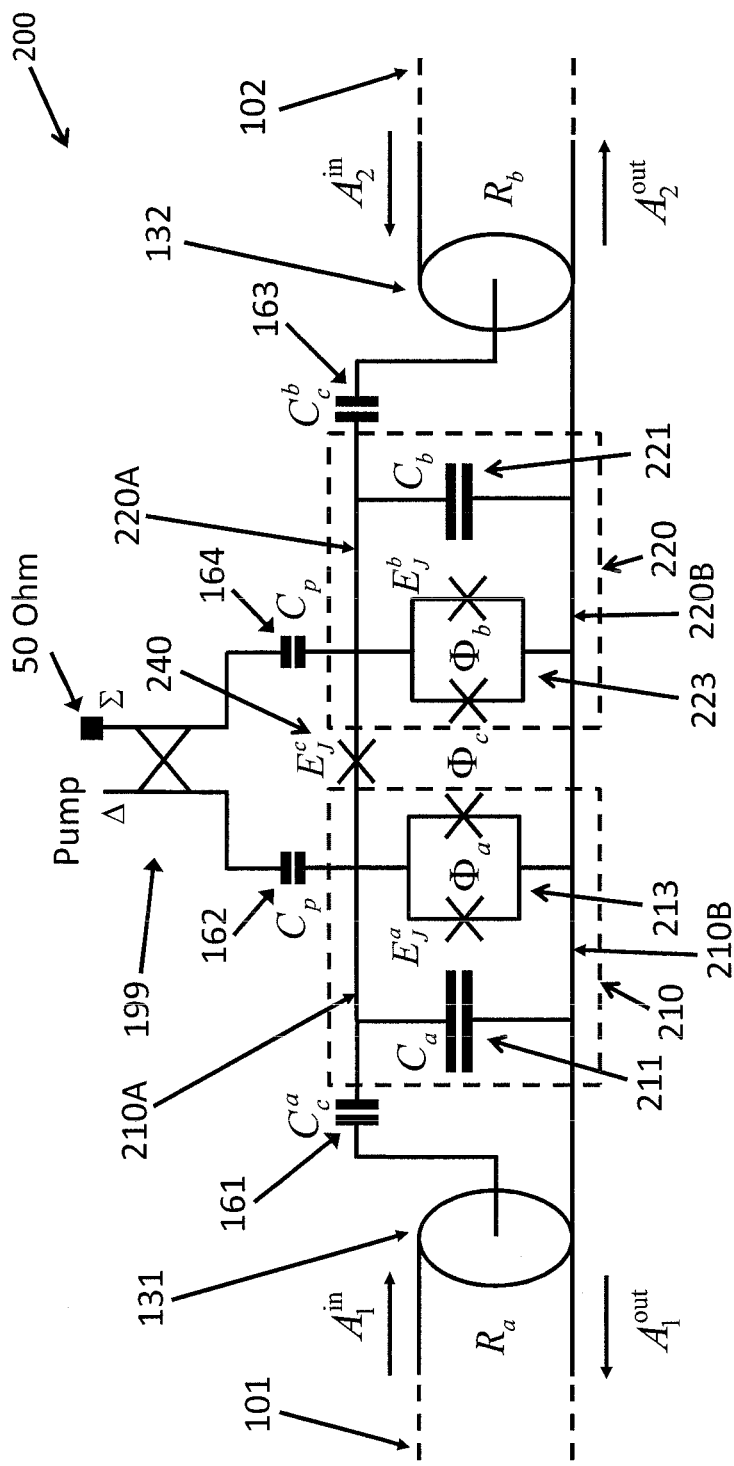
FIG. 2 shows another exemplary circuit for a Josephson-coupled resonator amplifier (JRA) 200, in accordance with an embodiment of the present principles.
Figure 4:
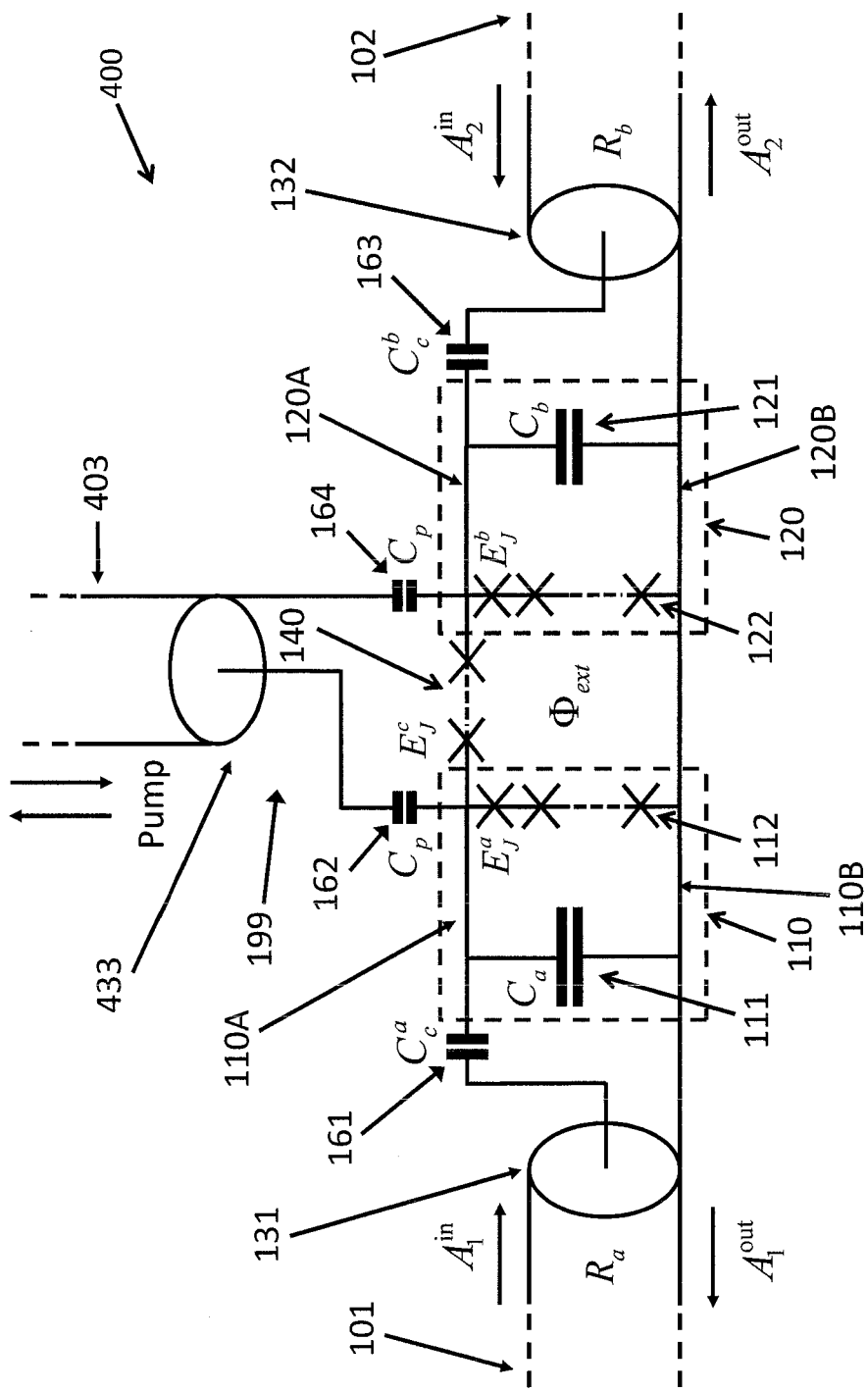
FIG. 4 shows yet another exemplary circuit for a Josephson-coupled resonator amplifier (JRA) 400 1, in accordance with an embodiment of the present principles.
Figure 5:
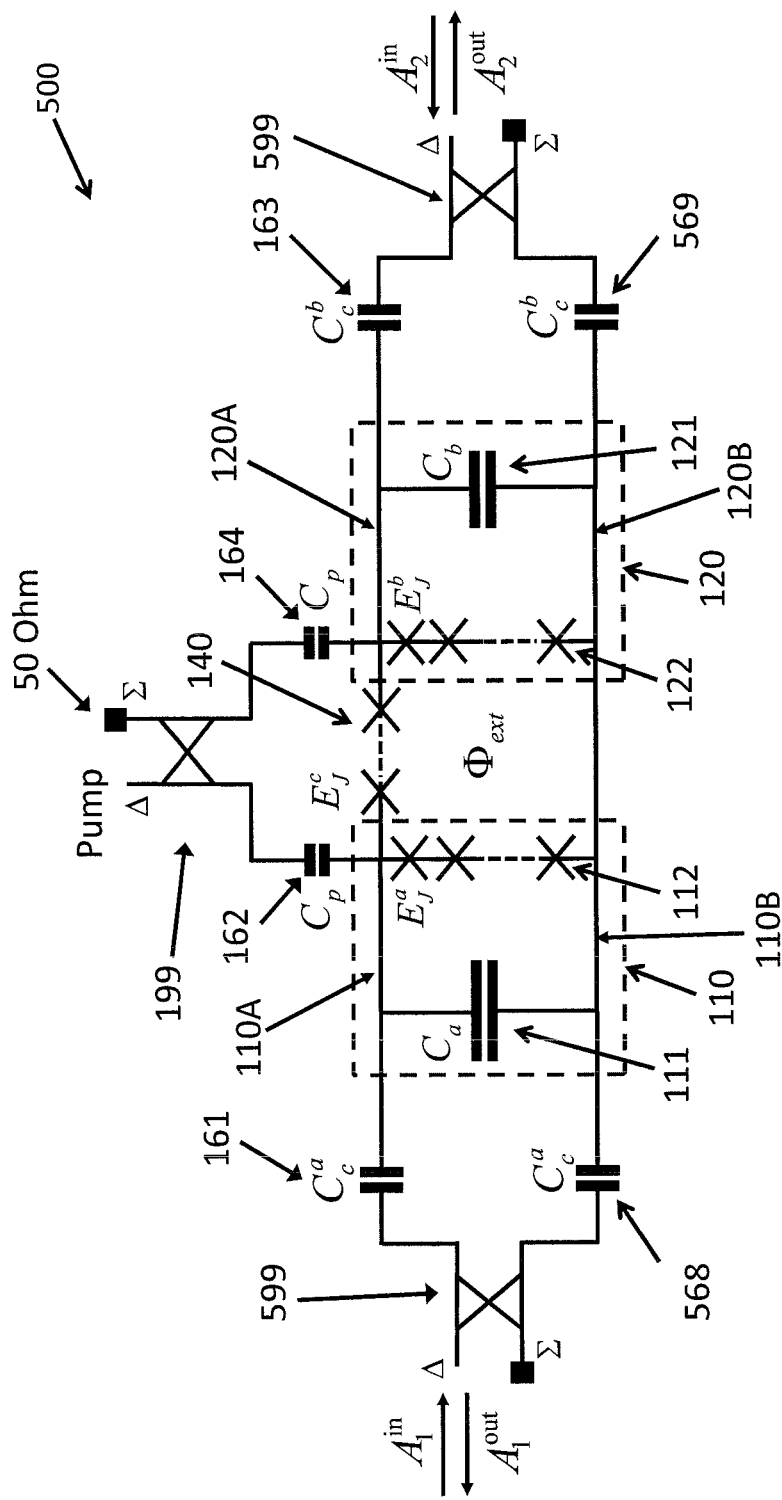
FIG. 5 shows still another exemplary circuit for a Josephson-coupled resonator amplifier (JRA) 500, in accordance with an embodiment of the present principles.

FIGS. 2, 4, and 5 show variants of the JPC 100 of FIG. 1. In particular, FIG. 2 shows another exemplary circuit for a Josephson-coupled resonator amplifier (JRA) 200 that employs direct current superconducting quantum interference devices (dc-SQUIDs) in the resonators 210 and 220 (in place of the one or more Josephson junctions in each of the resonators 110 and 120 in JRA 100), in accordance with an embodiment of the present principles. FIG. 4 shows yet another exemplary circuit for a Josephson-coupled resonator amplifier (JRA) 400 where the 180° hybrid 199 in JRA 100 is replaced by a semi-infinite transmission line 403 at a port 433 similar to ports 131 and 132 in JRA 100, in accordance with an embodiment of the present principles. FIG. 5 shows yet another exemplary circuit for a Josephson-coupled resonator amplifier (JRA) 500 where the semi-infinite transmission lines (101 and 102) on ports 131 and 132 are replaced by two 180° hybrids 599 (one on the left side and one on the right side), and the incoming and outgoing signals enter and exit through the delta port of the hybrids 599, in accordance with an embodiment of the present principles.

Referring now to FIG. 2, JRA 200 includes, in addition to the elements shown that are common to JRA 100, a first resonator 210 and a second resonator 220. The first resonator 210 and the second resonator 220 can have different impedances. The first resonator 210 has a resonance frequency $f_a$, and the second resonator 220 has a resonance frequency $f_b$. The first resonator 210 includes lumped-element capacitance in the form of a first capacitor $C_a$ 211. The first resonator 210 also includes lumped-element inductance in the form of one or more (e.g., an array of) dc-SQUIDs 213 characterized by Josephson energies $E_j^a$. The second resonator 220 includes lumped-element capacitance in the form of a first capacitor $C_b$ 221. The second resonator 220 also includes lumped-element inductance in the form of one or more (e.g., an array of) dc-SQUIDs 223 characterized by Josephson energies $E_j^b$. Each of dc-SQUIDs has two Josephson Junctions in parallel in a superconducting loop. The two Josephson junctions in the dc-SQUIDs can be nominally identical or different. A first magnetic field $\varphi_a$ is applied to the superconducting loop of the one or more dc-SQUIDs 213 of the first resonator 210. A second magnetic field $\varphi_b$ is applied to the superconducting loop of the one or more dc-SQUIDs 223 of the second resonator 220.

The first resonator 210 is connected to first semi-infinite transmission line 101 corresponding to first port 131. The second resonator 220 is connected to second semi-infinite transmission line 102 corresponding to second port 132. The first semi-infinite transmission line 101 and the second semi-infinite transmission line 102 carry incoming and outgoing waves to the JRA 200. For example, the first semi-infinite transmission line 101 inputs signal $A_1^{in}$ and outputs signal $A_1^{out}$, and the second semi-infinite transmission line 102 inputs signal $A_2^{in}$ and outputs signal $A_2^{out}$. The first transmission line 101 has a characteristic impedance $R_a$, and the second transmission line 102 has a characteristic impedance $R_b$.

The first resonator 210 and the second resonator 220 are connected together through one or more (e.g., an array of) Josephson Junctions 240 (each characterized by a Josephson energy $E_j^c$). For example, the top node 210A of the first resonator 210 and the top node 220A of the second resonator 220 are connected together through one or more (e.g., an array of) Josephson Junctions C 240 (each characterized by Josephson energy $E_j^c$). The first resonator 210 includes a bottom node 210B, and the second resonator 220 includes a bottom node 220B. The bottom node 210B of the first resonator 210 is connected to the bottom node 220B of the second resonator 220.

The first transmission line 101 is connected to the first resonator 210 via coupling capacitor $C_c^a$ 161. The pump (P) is coupled to the first and second resonators 210 and 220 via coupling capacitors $C_p$ 162 and 164. The second transmission line 102 is connected to the second resonator 220 via a coupling capacitor $C_c^b$ 163. The 50 Ohm termination is coupled to the first and second resonators 210 and 220 via coupling capacitors $C_p$ 162 and 164.

The main advantage of substituting each single JJ in resonator a and b with a dc-SQUID is that the dc-SQUID can function as a flux-tunable inductor. By varying the magnetic flux threading the dc-SQUID loop, the total inductance of the dc-SQUID varies. This dependence of the dc-SQUID inductance on the applied flux is periodic with a period of flux-quantum. By varying the shunt inductance of each resonator, the resonance frequency $f_a$ and $f_b$ of the resonators a and b can be varied, respectively. Thus, the main advantage/purpose of adding the dc-SQUIDs is to make the bandwidth of the device tunable. However, the addition of this capability comes at the cost of added complexity to the operation of the device. This is because the applied fluxes threading the dc-SQUIDs in resonator a and b (which set the center frequencies of the resonators) and the flux bias working point $\Phi_c$ in the main loop (which gives rise to three-wave mixing process in the device) can be different. In order to be able to set these three fluxes independently, we use two or more flux lines (or magnetic coils). In summary, the device version with the dc-SQUIDs mainly allows the device to have tunable bandwidth at the cost of added complexity to the flux biasing scheme of the device.

Referring to FIG. 4, as noted above, JRA 400 is a variant of JRA 100, where the 180° hybrid in JRA 100 is replaced by a semi-infinite transmission line 403 at a port 433 in JRA 400 (similar to ports 131 and 132 in JRA 100). In general, each differential excitation through a delta port of an 180° hybrid can be substituted by a transmission line (or vice versa).

Referring to FIG. 5, as noted above, JRA 500 is a variant of JRA 100, where the semi-infinite transmission lines (101 and 102) on ports 131 and 132 in JRA 100 are replaced by two 180° degree hybrids 599 in JRA 500, and the incoming signals to and outgoing signals from JRA 500 enter and exit through the delta ports of the 180° degree hybrids 599. Moreover, JRA 500 further includes two additional coupling capacitors, namely $C_c^a$ 568 and $C_c^b$ 569 in order to maintain symmetry.

Figure 3:
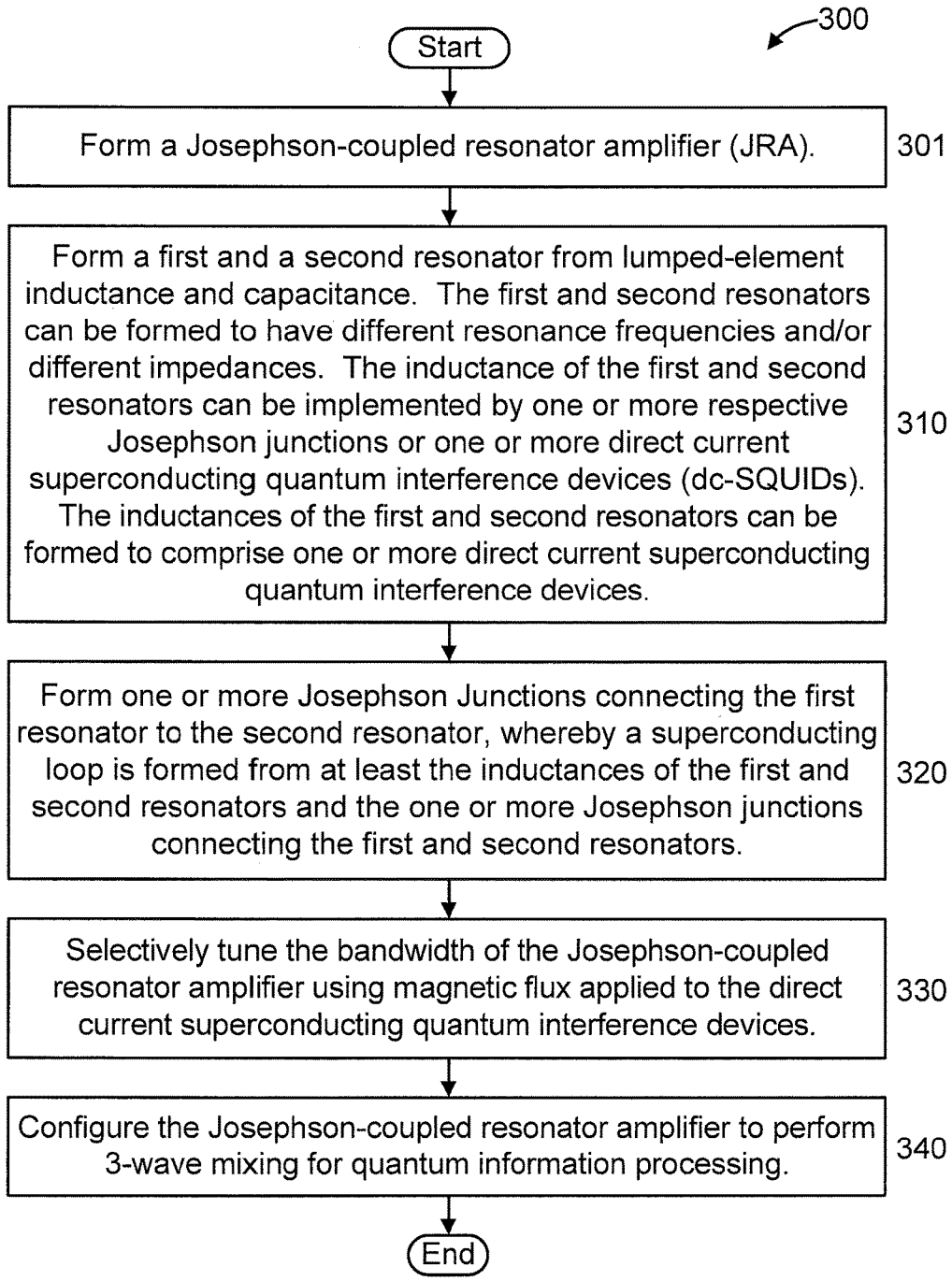
FIG. 3 shows an exemplary method 300 for forming a Josephson-coupled resonator amplifier (JRA), in accordance with an embodiment of the present principles.

FIG. 3 shows an exemplary method 300 for forming a Josephson-coupled resonator amplifier (JRA) 100, in accordance with an embodiment of the present principles. It is to be appreciated that one or more steps have been omitted from method 300 for the sake of brevity, but are readily apparent to one of ordinary skill in the art given the teachings of the present principles provided herein. For example, since the present principles are not dependent on the use of transmission lines and/or hybrid couplers, external connections using these elements are omitted from method 300. However, one of ordinary skill in the art will readily appreciate the manner in which such connections are made. Thus, method 300 can be used with any configuration of a JRA in accordance with the present principles, including any of JRA 100, JRA 200, JRA 400, and JRA 500. At step 301, form a Josephson-coupled resonator amplifier. Step 301 can include steps 310 through 340.

At step 310, form a first and a second resonator from lumped-element inductance and capacitance. In an embodiment, the first and second resonators are formed to have different resonance frequencies and/or different impedances. In an embodiment, the inductance of the first and second resonators can be implemented by one or more respective Josephson junctions or one or more direct current superconducting quantum interference devices (dc-SQUIDs). In an embodiment, the inductances of the first and second resonators can be formed to comprise one or more direct current superconducting quantum interference devices.

At step 320, form one or more Josephson Junctions connecting the first resonator to the second resonator, whereby a superconducting loop is formed from at least the inductances of the first and second resonators and the one or more Josephson junctions connecting the first and second resonators. At step 330, selectively tune the bandwidth of the Josephson-coupled resonator amplifier using magnetic flux applied to the direct current superconducting quantum interference devices. At step 340, configure the Josephson-coupled resonator amplifier to perform 3-wave mixing for quantum information processing.

A description will now be given regarding some exemplary advantages of the present principles can be applied.

As one advantage, the new proposed amplifier (JRA) combines the strengths of both Josephson bifurcation amplifiers (JBAs) and JPCs: the lumped-element realization of a JBA with the non-degenerate, three-wave mixing character of a JPC (temporal separation of the pump drive from the input signals and stiffer pump than the JBA because the pump in the JPC is a non-resonant drive).

As another advantage, the coupling constant between the interacting waves, first Signal, second Signal, and the Pump in the JRA that is mainly determined by the Josephson energy of the coupling Josephson junction $E_j^c$ (or array of JJs) can be set independently of the inductances of the two resonators (set by $E_j^a$ and $E_j^b$). This additional control knob is expected to be useful in relaxing the inherent trade-offs that exist between different performances of Josephson parametric amplifiers, in particular, gain, bandwidth, and dynamic range.

As yet another advantage, the JRA offers a more convenient topology than the JPC. The ports for the first Signal, second Signal, Pump, and flux-bias can be positioned at separate physical locations on chip.

As a further advantage, the JRA has a simpler drive circuit than present JPC devices.

Due to the preceding advantages relating to the JRA offering a more convenient topology and having a simpler drive circuit, the JRA might offer an alternative and simpler implementation for quantum-limited directional amplifiers by using it as a building block instead of the JPC.

A description will now be given regarding some exemplary applications to which the present principles can be applied.

The present principles can be used in the readout of solid state qubits such as superconducting qubits and quantum dots. For example, the present principles can be used to enhance the measurement fidelity, and allow for scalable readout architectures. The present principles can also be used, in general, to perform sensitive quantum measurements in the microwave domain, such as measuring nano-mechanical systems coupled to microwave resonators.

The present principles can be used in building wideband, large input power quantum-limited Josephson directional amplifiers and also on-chip dissipationless circulators. The present principles can be used (similar to JPCs but with enhanced performance) as ideal microwave mixers (performing upconversion and downconversion of microwave frequency without dissipation), controllable microwave beam-splitters, and fast, lossless microwave switches.

The present principles can also find some applications in improving the sensitivity of microwave measurements in the areas of astronomy and cosmology.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punchcards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Java, Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This may be extended, as readily apparent by one of ordinary skill in this and related arts, for as many items listed.

Having described preferred embodiments of a system and method (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. An apparatus, comprising:
   a Josephson-coupled resonator amplifier, including:
      a first and a second resonator, each formed from respective lumped-element capacitance and respective lumped-element inductance; and
      one or more Josephson junctions coupling the first resonator to the second resonator, whereby a superconducting loop is formed from at least the lumped-element inductance of the resonators and one or more Josephson junctions.

2. The apparatus of claim 1, wherein the first and second resonators have at least one of different resonance frequencies and different impedances.

3. The apparatus of claim 1, wherein the lumped-element inductance forming each of the resonators comprises one or more Josephson junctions, wherein the first resonator comprises at least a first capacitor and the second resonator comprises at least a second capacitor, and wherein the one or more Josephson junctions in the first resonator are arranged in parallel with respect to the first capacitor and the one or more Josephson junctions in the second resonator are arranged in parallel with respect to the second capacitor.

4. The apparatus of claim 1, further comprising:
   a first capacitor having a first end connected to the first resonator and a second end for connecting to a transmission line; and
   a second capacitor having a first end connected to the second resonator and a second end for connecting to another transmission line,
   wherein the first and second capacitors are lumped-element capacitors.

5. The apparatus of claim 1, further comprising:
   a first pair of capacitors, each having a first end connected to a respective node of the first resonator; and
   a second pair of capacitors having a first end connected to a respective node of the second resonator,
   wherein each of the capacitors in the first pair and the second pair have a second end for connecting to a respective port of at least one 180 hybrid coupler, and wherein the first and second pair of capacitors are lumped-elements capacitors.

6. The apparatus of claim 1, wherein the one or more Josephson junctions are arranged in series and have a first end and a second end, and the Josephson-coupled resonator amplifier further comprises:
   a first pump drive coupling capacitor having a first end connected to the first end of the one or more Josephson junctions and a second end for connecting to one of a center conductor or an outer conductor of a transmission line carrying the pump drive; and
   a second pump drive coupling capacitor having a first end connected to the second end of the one or more Josephson junctions and a second end for connecting to another one of the center conductor and the outer conductor of the transmission line carrying the pump drive;

wherein the first and second capacitors are lumped-element capacitors.

7. The apparatus of claim 1, wherein ports of the Josephson-coupled resonator amplifier are disposed at different on-chip locations.

8. The apparatus of claim 1, wherein the Josephson-coupled resonator amplifier is configured to have two spatial microwave ports for carrying incoming and outgoing signals from and to the amplifier and one additional spatial port for supplying a microwave pump drive to the amplifier.

9. The apparatus of claim 1, wherein the Josephson-coupled resonator amplifier is configured to perform three-wave mixing for quantum information processing.

10. An apparatus, comprising:
a Josephson-coupled resonator amplifier including:
a first and a second resonator, each formed from respective lumped-element capacitance and inductances of one or more direct current superconducting quantum interference devices; and
one or more Josephson junctions coupling the first resonator to the second resonator, whereby a superconducting loop is formed from at least the inductances of the direct current superconducting quantum interference devices and the one or more Josephson junctions.

11. The apparatus of claim 10, wherein the first resonator comprises at least a first capacitor and the second resonator comprises at least a second capacitor, and wherein the one or more direct current superconducting quantum interference devices in the first resonator are arranged in parallel with respect to the first capacitor and the one or more direct current superconducting quantum interference devices in the second resonator are arranged in parallel with respect to the second capacitor.

12. The apparatus of claim 10, wherein the first and second resonators have at least one of different resonance frequencies and different impedances.

13. The apparatus of claim 10, wherein the Josephson-coupled resonator amplifier is configured to have two spatial microwave ports for carrying incoming and outgoing signals from and to the amplifier and one additional spatial port for supplying a microwave pump drive to the amplifier.

14. The apparatus of claim 10, wherein a bandwidth of the Josephson-coupled resonator amplifier is selectably tunable using magnetic flux applied to the direct current superconducting quantum interference devices.

15. A method, comprising:
forming a Josephson-coupled resonator amplifier, wherein said forming step includes:
forming a first and a second resonator from respective lumped-element inductances and capacitances; and
forming one or more Josephson Junctions connecting the first resonator to the second resonator, whereby a superconducting loop is formed from at least the inductances of the first and second resonators and the one or more Josephson junctions.

16. The method of claim 15, wherein the first and second resonators are formed to have at least one of different resonance frequencies and different impedances.

17. The method of claim 15, wherein the inductances of the first and second resonators are formed to comprise one or more direct current superconducting quantum interference devices.

18. The method of claim 17, further comprising selectably tuning a bandwidth of the Josephson-coupled resonator amplifier using magnetic flux applied to the direct current superconducting quantum interference devices.

19. The method of claim 15, wherein the inductances of the first and second resonators are each formed to comprise at least one respective Josephson Junction.

20. The method of claim 15, wherein ports of the Josephson-coupled resonator amplifier are disposed at different on-chip locations.

* * * * *